(12) United States Patent
Okuda et al.

(10) Patent No.: US 10,310,049 B2
(45) Date of Patent: Jun. 4, 2019

(54) SEMICONDUCTOR DEVICE AND FAILURE DETECTION METHOD

(71) Applicant: Renesas Electronics Corporation, Tokyo (JP)

(72) Inventors: Yuichi Okuda, Tokyo (JP); Hideo Nakane, Tokyo (JP); Takaya Yamamoto, Tokyo (JP); Keisuke Kimura, Tokyo (JP); Takashi Oshima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/218,006

(22) Filed: Jul. 23, 2016

(65) Prior Publication Data

US 2017/0045578 A1 Feb. 16, 2017

(30) Foreign Application Priority Data

Aug. 10, 2015 (JP) .................. 2015-157914

(51) Int. Cl.
*G01R 31/3163* (2006.01)
*H03M 1/10* (2006.01)
(Continued)

(52) U.S. Cl.
CPC ......... *G01R 35/00* (2013.01); *G01R 19/2509* (2013.01); *H03M 1/10* (2013.01);
(Continued)

(58) Field of Classification Search
CPC ............. G01R 31/2601; G01R 31/26; G01R 31/2642; G01R 31/2621; G01R 31/2853
(Continued)

(56) References Cited

U.S. PATENT DOCUMENTS 6,694,464 B1 * 2/2004 Quayle .............. G01R 31/2853
714/725
7,512,508 B2 * 3/2009 Rajski .................... G01R 31/01
438/14
(Continued)

FOREIGN PATENT DOCUMENTS

JP 2014-014054 A 1/2014

OTHER PUBLICATIONS

Panigada, Andrea, and Ian Galton. "A 130 mW 100 MS/s pipelined ADC with 69 dB SNDR enabled by digital harmonic distortion correction." IEEE Journal of Solid-State Circuits 44.12 (2009): 3314-3328. APA.*
(Continued)

*Primary Examiner* — Christopher P McAndrew
(74) *Attorney, Agent, or Firm* — McGinn IP Law Group, PLLC

(57) ABSTRACT

The present invention provides a semiconductor device and a failure detection method capable of detecting an excessive variation among elements that constitute an analog circuit as a failure. According to an embodiment, a semiconductor device 1 includes: an AD converter 11; a digital assist circuit 12 that corrects an error of a digital signal Do corresponding to an analog signal Ain processed by the AD converter 11; and a failure detection circuit 13 that detects whether the AD converter 11 has a failure based on a correction amount by the digital assist circuit. The semiconductor device 1 is therefore able to detect the excessive variation among the elements that constitute the AD converter 11 as a failure.

18 Claims, 17 Drawing Sheets

(51) Int. Cl.
G01R 19/25 (2006.01)
G01R 35/00 (2006.01)
H03M 1/46 (2006.01)

(52) U.S. Cl.
CPC ....... H03M 1/1038 (2013.01); H03M 1/1076 (2013.01); H03M 1/468 (2013.01)

(58) Field of Classification Search
USPC ...................................... 324/762.1
See application file for complete search history.

(56) References Cited

U.S. PATENT DOCUMENTS

| | | | | |
|---|---|---|---|---|
| 7,987,442 | B2* | 7/2011 | Rajski | G01R 31/01 714/737 |
| 8,773,157 | B2* | 7/2014 | Badaroglu | G01R 31/318513 324/750.01 |
| 2007/0052438 | A1* | 3/2007 | Binkley | G01R 31/3004 324/762.01 |
| 2008/0232145 | A1* | 9/2008 | Hiller | H02H 7/1225 363/56.01 |
| 2014/0091830 | A1* | 4/2014 | Ishida et al. | G01R 31/31721 324/762.01 |
| 2015/0061724 | A1* | 3/2015 | Mittl | G06F 19/00 324/762.01 |

OTHER PUBLICATIONS

Lewis, Stephen H., R. Ramachandran, and W. M. Snelgrove. "Indirect testing of digital-correction circuits in analog-to-digital converters with redundancy." IEEE Transactions on Circuits and Systems II: Analog and Digital Signal Processing 42.7 (1995): 437-445.*

Boni, A., G. Chiorboli, and G. Franco. "Test and diagnosis of subranging A/D converters." Instrumentation and Measurement Technology Conference, 1996. IMTC-96. Conference Proceedings. Quality Measurements: The Indispensable Bridge between Theory and Reality., IEEE. vol. 2. IEEE, 1996.*

Mangelsdorf, Chris, et al. "Design for testability in digitally-corrected ADCs." Solid-State Circuits Conference, 1993. Digest of Technical Papers. 40th ISSCC., 1993 IEEE International. IEEE, 1993.*

Arpaia, Pasquale, Pasquale Daponte, and Linus Michaeli. "Influence of the architecture on ADC error modeling." IEEE Transactions on Instrumentation and Measurement 48.5 (1999): 956-966.*

Peralias, Eduardo, Adoracion Rueda, and Jose L. Huertas. "A DFT technique for analog-to-digital converters with digital correction." VLSI Test Symposium, 1997., 15th IEEE. IEEE, 1997.*

Zjajo, Amir, et al. "Power-scan chain: design for analog testability." Test Conference, 2005. Proceedings. ITC 2005. IEEE International. IEEE, 2005.*

Zjajo, Amir, and Jose Pineda de Gyvez. "DfT for full accessibility of multi-step analog to digital converters." VLSI Design, Automation and Test, 2008. VLSI-DAT 2008. IEEE International Symposium on. IEEE, 2008.*

Peralias, Eduardo, et al. "DFT and on-line test of high-performance data converters: a practical case." Test Conference, 1998. Proceedings., International. IEEE, 1998.*

Peralias, Eduardo, Adoracion Rueda, and Jos6 L. Huertas. "CMOS pipelined A/D converters with concurrent error detection capability." Electronics, Circuits and Systems, 1998 IEEE International Conference on. vol. 2. IEEE, 1998.*

Vanessa H. C. Chen and Lawrence Pileggi, "An 8.5mW 5GS/s 6bFlash ADC with Dynamic Offset Calibration in 32nm CMOS SOI", 2013 Symposium on VLSI Circuits Digest of Technical Papers, pp. 264-265.

Bob Verbruggen et al, "A 2.1 mW lib 410 MS/s Dynamic Pipelined SAR ADC with Background Calibration in 28nm Digital CMOS", 2013 Symposium on VLSI Circuits Digest of Technical Papers, pp. 268-269.

Japanese Office Action dated Dec. 11, 2018, in Japanese Patent Application No. 2015-157914 with an English translation.

* cited by examiner

|  | AT TIME OF MANUFACTURING | WHEN LEAK CURRENT OCCURS AND RE-CORRECTION IS EXECUTED | ratio |
|---|---|---|---|
| w13 | 2048.00 | 2051.50 | 1.00171 |
| w12 | 1107.00 | 1105.35 | 0.99851 |
| w11 | 598.50 | 599.25 | 1.00125 |
| w10 | 323.50 | 323.50 | 1.00000 |
| w9 | 161.75 | 162.25 | 1.00309 |
| w8 | 87.50 | 87.50 | 1.00000 |
| w7 | 47.25 | 47.25 | 1.00000 |
| w6 | 23.50 | 23.50 | 1.00000 |
| w5 | 11.75 | 11.75 | 1.00000 |
| w4 | 6.00 | 6.00 | 1.00000 |
| w3 | 3.00 | 3.00 | 1.00000 |
| w2 | 1.50 | 1.50 | 1.00000 |
| w1 | 0.75 | 0.75 | 1.00000 |
| w0 | 0.50 | 0.50 | 1.00000 |

Fig. 8

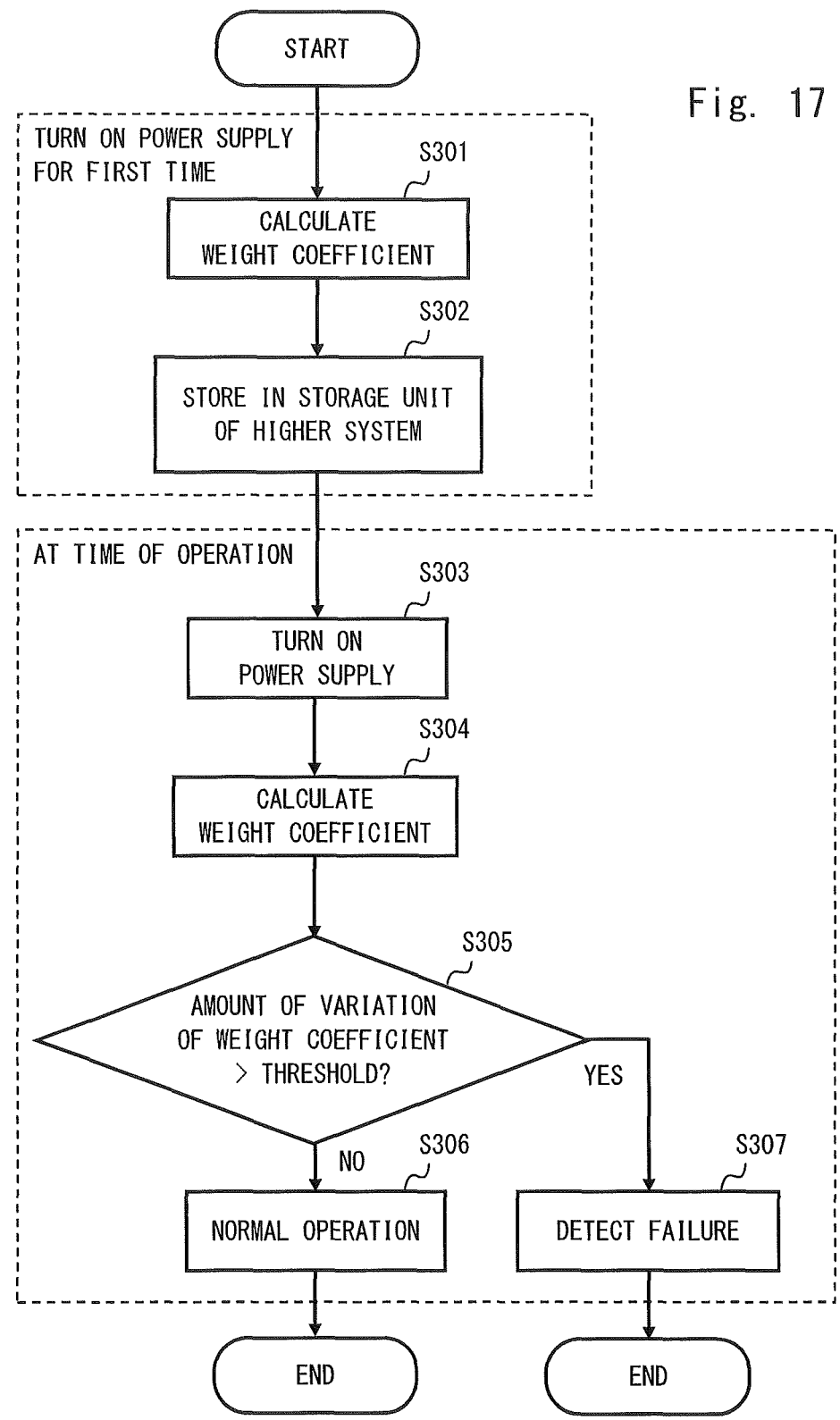

SEMICONDUCTOR DEVICE AND FAILURE DETECTION METHOD

CROSS-REFERENCE TO RELATED APPLICATIONS

This application is based upon and claims the benefit of priority from Japanese patent application No. 2015-157914, filed on Aug. 10, 2015, the disclosure of which is incorporated herein in its entirety by reference.

BACKGROUND

The present invention relates to a semiconductor device and a failure detection method and relates to, for example, a semiconductor device and a failure detection method capable of detecting an excessive variation among elements that constitute an analog circuit as a failure.

It has been required that an AD converter have a low power consumption, a high speed, and a high accuracy. One problem that interrupts the providing of the AD converter with low power consumption, high speed, and high accuracy is a variation among elements such as a capacitor, a transistor and the like that constitute the AD converter.

In general, the accuracy of the AD converter is increased by a method of increasing the sizes of elements and relatively decreasing variation among the elements (hereinafter it may be referred to as an element variation). In this method, however, the size of the circuit becomes large. It is therefore difficult to achieve an AD converter having high speed and low power consumption.

In order to solve the above problem, in recent years, a technique for correcting the element variation in a digital manner has been employed. By correcting the element variation in the digital manner, the sizes of the elements need not be increased. It is therefore possible to suppress an increase in the size of the circuit, whereby it is possible to achieve an AD converter having high speed and low power consumption.

The above method requires, however, a nonvolatile memory or a storage area of a fuse to store a correction value (digital value) of the element variation at the time of manufacturing the AD converter, which increases the cost.

In order to solve the above problem, an AD converter having a digital assist function that calculates a non-linear error caused by the element variation during operation and corrects the non-linear error has been developed. A technique regarding the AD converter including the digital assist function is disclosed, for example, in "Vanessa H. C. Chen and Lawrence Pileggi, "An 8.5 mW 5 GS/s 6b Flash ADC with Dynamic Offset Calibration in 32 nm CMOS SOI", 2013 Symposium on VLSI Circuits Digest of Technical Papers, pp. 264-265" and "Bob Verbruggen et al, "A 2.1 mW 11b 410 MS/s Dynamic Pipelined SAR ADC with Background Calibration in 28 nm Digital CMOS", 2013 Symposium on VLSI Circuits Digest of Technical Papers, pp. 268-269".

SUMMARY

It is required to detect, when the elements that constitute the analog circuit are excessively varied due to deterioration over time or the like, the variation as a failure in order to improve reliability of the analog circuit such as the AD converter.

The configuration according to the related art does not include, however, means for detecting the excessive variation among the elements that constitute the analog circuit as a failure. That is, according to the configuration of the related art, it is impossible to detect the excessive variation among the elements that constitute the analog circuit as a failure.

The other problems of the related art and the novel characteristics of the present invention will be made apparent from the descriptions of the specification and the accompanying drawings.

According to an embodiment, a semiconductor device includes an analog circuit, a digital assist circuit that corrects an error of a digital signal corresponding to an analog signal processed by the analog circuit, and a failure detection circuit that detects whether the analog circuit has a failure based on a correction amount by the digital assist circuit.

According to an embodiment, a failure detection method corrects an error of a digital signal corresponding to an analog signal processed by an analog circuit using a digital assist circuit and detects whether the analog circuit has a failure based on a correction amount by the digital assist circuit.

According to an embodiment, a failure detection method corrects a non-linear error of a digital signal output from an AD converter corresponding to an analog signal input to the AD converter using a digital assist circuit and detects whether the AD converter has a failure based on a correction amount by the digital assist circuit.

According to the above embodiments, it is possible to provide a semiconductor device and a failure detection method capable of detecting an excessive variation among elements that constitute an analog circuit as a failure.

BRIEF DESCRIPTION OF THE DRAWINGS

The above and other aspects, advantages and features will be more apparent from the following description of certain embodiments taken in conjunction with the accompanying drawings, in which:

FIG. 8 is a diagram showing a weight coefficient for each bit at different temperatures of the DA converter provided in the AD converter shown in FIG. 2;

FIG. 17 is a flowchart showing an operation of the semiconductor system shown in FIG. 16.

DETAILED DESCRIPTION

Figure 1:
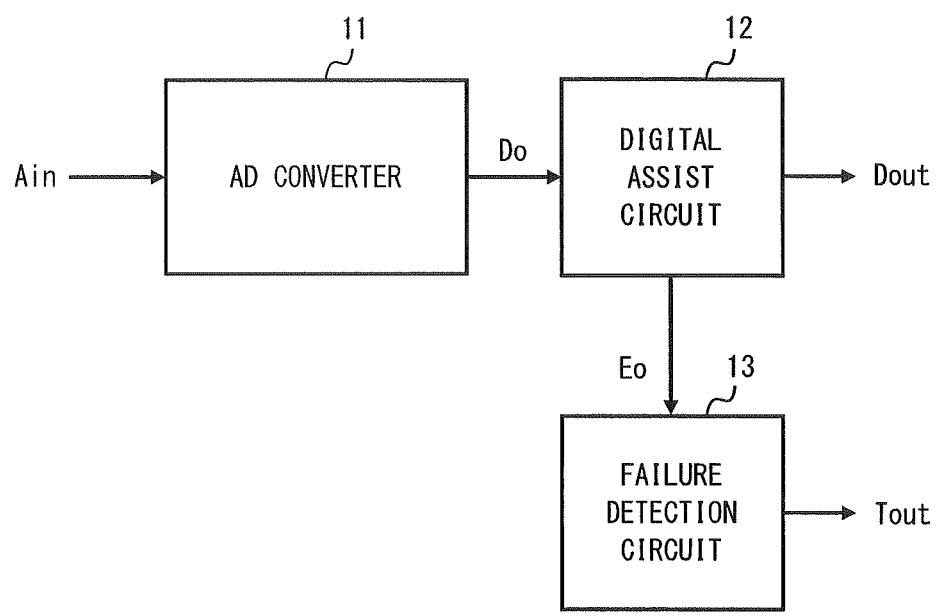
FIG. 1 is a block diagram showing a configuration example of a semiconductor device according to a first embodiment.

Embodiments of the present invention will be described below with reference to the accompanying drawings. Note that the drawings are in simplified form, and the technical scope of the embodiments should not be interpreted to be limited to the drawings. The same elements are denoted by the same reference numerals, and a duplicate description is omitted.

In the following embodiments, when necessary, the present invention is explained by using separate sections or separate embodiments. However, those embodiments are not unrelated with each other, unless otherwise specified. That is, they are related in such a manner that one embodiment is a modified example, an application example, a detailed example, or a supplementary example of a part or the whole of another embodiment. Further, in the following embodiments, when the number of elements or the like (including numbers, values, quantities, ranges, and the like) is mentioned, the number is not limited to that specific number except for cases where the number is explicitly specified or the number is obviously limited to a specific number based on its principle. That is, a larger number or a smaller number than the specific number may also be used.

Further, in the following embodiments, the components (including operation steps and the like) are not necessarily indispensable except for cases where the component is explicitly specified or the component is obviously indispensable based on its principle. Similarly, in the following embodiments, when a shape, a position relation, or the like of a component(s) or the like is mentioned, shapes or the like that are substantially similar to or resemble that shape are also included in that shape except for cases where it is explicitly specified or they are eliminated based on its principle. This is also true for the above-described number or the like (including numbers, values, quantities, ranges, and the like).

<First Embodiment>

FIG. 1 is a block diagram showing a configuration example of a semiconductor device 1 according to a first embodiment. The semiconductor device 1 according to this embodiment includes a digital assist circuit that corrects a non-linear error of a digital signal output from an AD converter and detects an excessive variation due to deterioration over time or the like of elements that constitute the AD converter as a failure based on the correction amount by the digital assist circuit. This point will be described hereinafter in detail.

As shown in FIG. 1, the semiconductor device 1 is an AD converter that includes a so-called digital assist function and includes an AD converter 11, a digital assist circuit 12, and a failure detection circuit 13. While a case in which the semiconductor device 1 is formed on one semiconductor chip will be described, the present invention is not limited to this example and the semiconductor device 1 may be formed on a plurality of semiconductor chips that are combined with each other.

The AD converter 11 converts an analog signal Ain input from outside into a digital signal (digital code) Do and outputs the digital signal (digital code) Do. The digital assist circuit 12 detects a non-linear error of the digital signal Do corresponding to the analog signal Ain, corrects the non-linear error, and outputs the resulting signal as a digital signal Dout.

Figure 2:
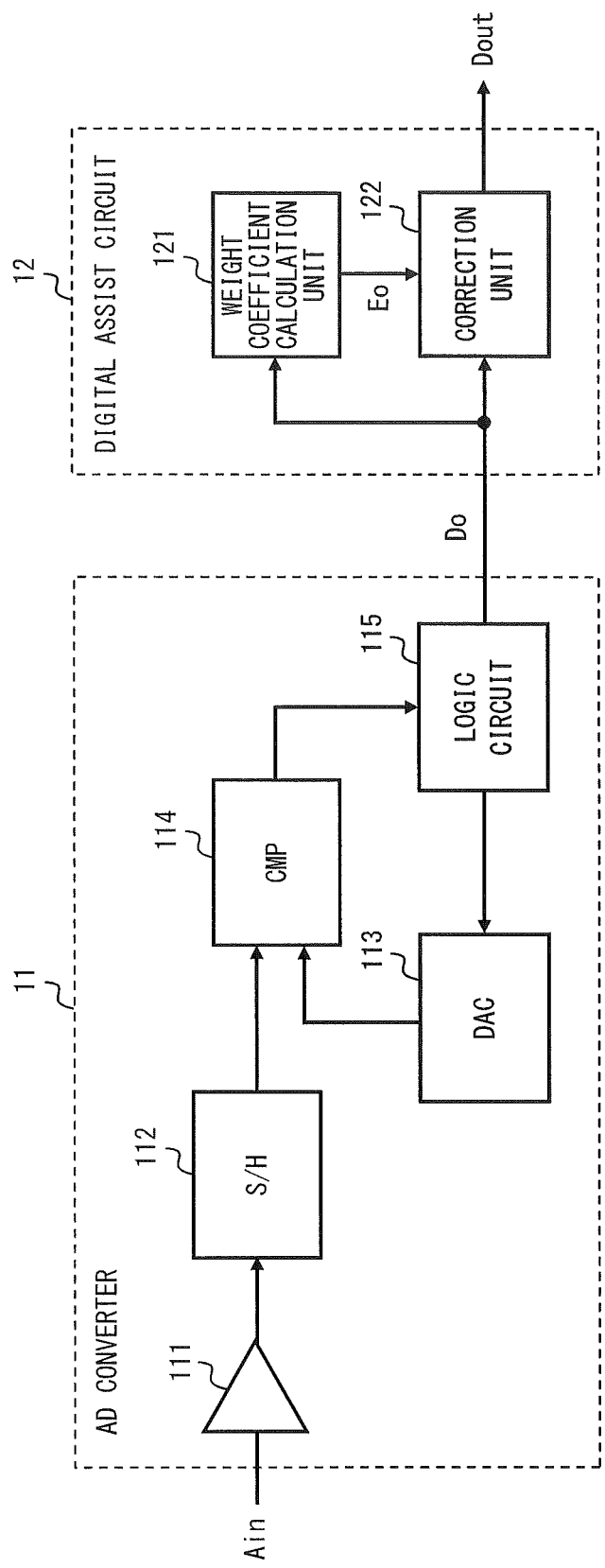
FIG. 2 is a block diagram showing a configuration example of an AD converter and a digital assist circuit provided in the semiconductor device shown in FIG. 1.

FIG. 2 is a block diagram showing a configuration example of the AD converter 11 and the digital assist circuit 12. As shown in FIG. 2, the AD converter 11 is, for example, a successive approximation AD converter, and includes a buffer amplifier 111, a sample and hold circuit (S/H) 112, a DA converter (DAC) 113, a comparator (CMP) 114, and a SAR logic circuit 115. The digital assist circuit 12 includes a weight coefficient calculation unit 121 and a correction unit 122.

In the AD converter 11, the sample and hold circuit 112 receives the analog signal Ain in synchronization with a clock signal and holds the voltage of the analog signal Ain. The comparator 114 compares the voltage of the analog signal Ain held by the sample and hold circuit 112 with an output voltage of the DA converter 113 and outputs the result of the comparison. The SAR logic circuit 115 controls, based on the result of the comparison in the comparator 114, the digital code to be input to the DA converter 113 so that the voltage of the analog signal Ain held by the sample and hold circuit 112 coincides with the output voltage of the DA converter 113. The SAR logic circuit 115 then outputs the digital code in which the voltage of the analog signal Ain held by the sample and hold circuit 112 coincides with the output voltage of the DA converter 113 as the digital signal Do of the AD converter 11.

In the digital assist circuit 12, the weight coefficient calculation unit 121 detects the non-linear error of the digital signal Do and calculates a correction amount Eo (weight coefficient) of the digital signal Do based on the result of the detection. The correction unit 122 then adds the correction amount Eo calculated by the weight coefficient calculation unit 121 to the digital signal Do, corrects the error of the digital signal Do, and outputs the resulting signal as the digital signal Dout.

There are various available methods of correcting the non-linear error by the digital assist circuit 12 such as a method of using a Least Mean Square (LMS) algorithm for a teacher signal and a method of using a statistical method.

Figure 3:
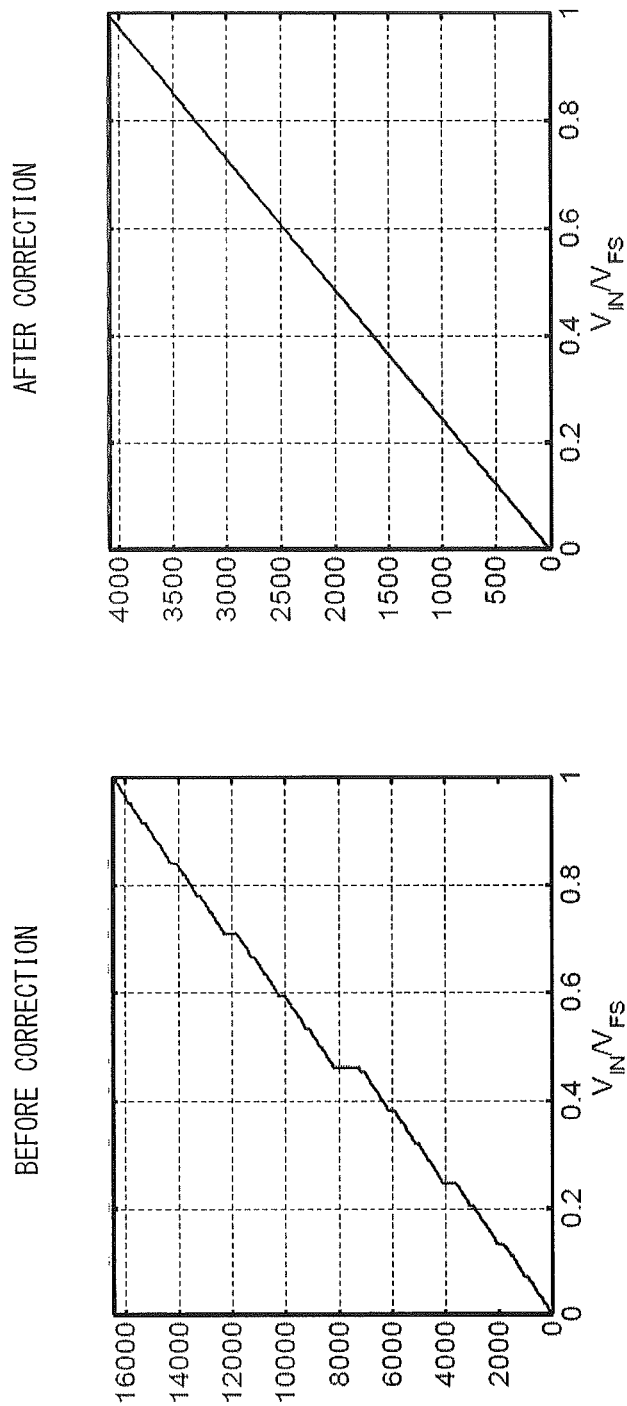
FIG. 3 shows diagrams showing a relation between an input analog value and an output digital code before and after a correction is executed by a digital assist circuit provided in the semiconductor device shown in FIG. 1.

FIG. 3 shows diagrams showing a relation between an input analog value and an output digital code before and after the correction by the digital assist circuit 12. In FIG. 3, the horizontal axis indicates a value obtained by dividing a voltage value Vin of the analog signal Ain by a full-scale voltage value Vfs and the vertical axis indicates the digital code of the digital signals Do and Dout. As will be clear from FIG. 3, the non-linear error of the digital signal Do is corrected by the digital assist circuit 12.

(Description Regarding Redundancy of DA Converter 113)

In the AD converter 11 to which the digital assist circuit 12 is added, the DA converter 113 embedded in the AD converter 11 has a redundancy. This point will be described hereinafter in detail.

In general, the absolute value of each bit of the DA converter 113 can be expressed, for example, by $(1/2)^n$. The absolute value of the Most Significant Bit (MSB) is 1/2, the absolute value of MSB-1 is 1/4, and the absolute value of MSB-2 is 1/8, for example. Therefore, the ratio of the absolute values between adjacent bits is 1/2. The ratio of the absolute values between the adjacent bits is referred to as radix. For example, radix is expressed by MSB/(MSB-1).

Figure 4:
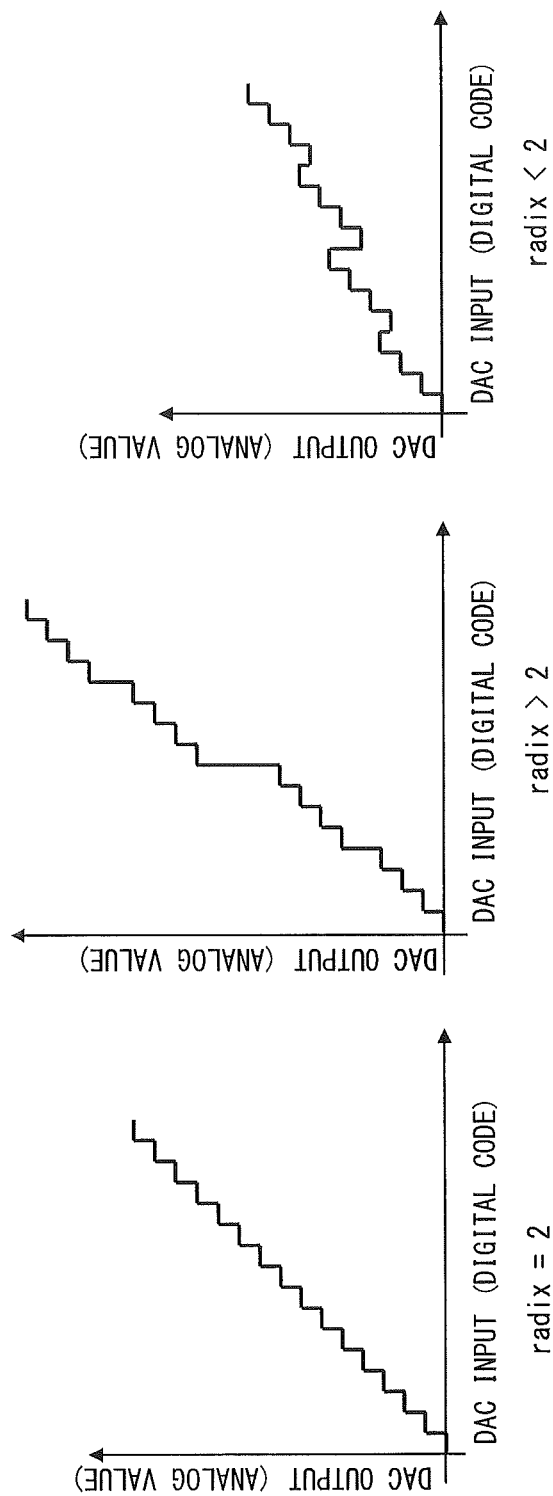
FIG. 4 shows diagrams showing a relation between an input digital code and an output analog value of a DA converter when radix=2, radix>2, and radix<2.

FIG. 4 shows diagrams showing a relation between an input digital code and an output analog value of the DA converter 113 when radix=2, radix>2, and radix<2.

When radix=2, for example, one output analog value corresponds to one input digital code in the DA converter 113 (see the left diagram of FIG. 4). In a DA converter or the like embedded in a general successive approximation AD converter that does not include the digital assist function, radix is normally set to 2.

On the other hand, when radix>2, a plurality of output analog values may correspond to one input digital code in the DA converter 113. In this case, a large skip occurs in the output analog value (see the middle diagram of FIG. 4).

Further, when radix<2, in the DA converter 113, there is a case in which one output analog value corresponds to a plurality of input digital codes (see the right diagram of FIG. 4).

The relation between the input analog value and the output digital code of the AD converter 11 becomes opposite to the relation between the input digital code and the output analog value of the DA converter 113. That is, when radix=2, one output digital code corresponds to one input analog value. Further, when radix>2, there is a case in which one output digital code corresponds to a plurality of input analog values. This means that there is a point at which the output digital code does not change even when the input analog value changes (missing decision point). Further, when radix<2, there is a case in which a plurality of output digital codes correspond to one input analog value. In this case, since one of the plurality of digital codes is output, there are digital codes that are not output (missing codes).

When the value of radix is deviated even when radix is set to 2, it causes degradation in the non-linear error such as a differential non-linearity error (Differential Non-Linearity: DNL) or an integral non-linearity error (Integral Non-Linearity: INL). Considering the basic operation of the AD converter 11 that converts an analog value into a digital code, however, while information on the analog value is missing in the digital code when radix>2, a plurality of pieces of information on the analog value exist in the digital code and information on the analog value is not missing when radix<2. That there are a plurality of digital codes with respect to one input analog value means that the DA converter 113 has a redundancy.

The general successive approximation AD converter that does not include the digital assist function is designed in such a way that the variation among the elements that constitute the DA converter included in the AD converter 11 is minimized (e.g., the AD converter is designed so that the variation among the elements becomes smaller than 0.5 LSB). It is therefore possible to suppress degradation of the DNL and the INL.

On the other hand, the AD converter 11 to which the digital assist circuit 12 is added is designed in such a way that the variation among the elements that constitute the DA converter 113 included in the AD converter 11 satisfies radix<2. Therefore, even when there is a variation in radix, as long as radix does not exceed 2, the information on the input analog value is not missing in the digital code. Further, the non-linear error caused by the variation among the elements that constitute the DA converter 113 is corrected by the digital assist circuit 12. As a result, it is possible to achieve AD conversion with high accuracy in which degradation of the DNL and the INL is suppressed.

(Description Regarding Deterioration Over Time of AD Converter 11)

Next, deterioration over time of the AD converter 11 will be described. The deterioration over time of the AD converter 11 includes deterioration over time of each of the DA converter 113, the comparator 114, and the SAR logic circuit 115.

The deterioration over time of the DA converter 113 includes, for example, degradation in linearity thereof and an increase in settling time thereof. The deterioration over time of the comparator 114 includes, for example, a change in offset voltages, an increase in time for a determination, and an increase in noise. The deterioration over time of the SAR logic circuit 115 includes, similar to a general logic circuit, a change in logical values due to a stuck-at fault or the like.

(Description Regarding Deterioration Over Time of DA Converter 113 Provided in AD Converter 11)

Hereinafter, with reference to FIG. 5, degradation in the linearity of the DA converter 113 will be described.

Figure 5:
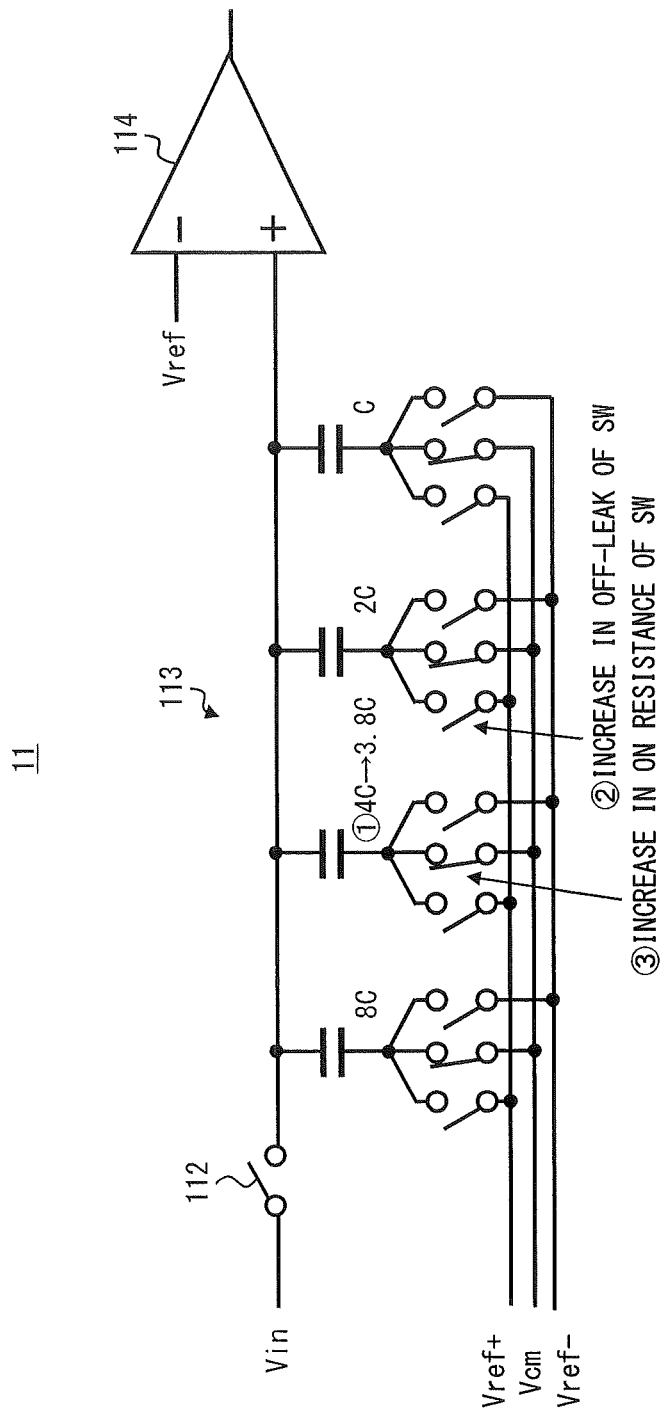
FIG. 5 is a circuit diagram showing a specific configuration of the DA converter provided in the AD converter shown in FIG. 2.

FIG. 5 is a circuit diagram showing a specific configuration of the DA converter 113.

As shown in FIG. 5, the DA converter 113 is a capacity-array type DA converter and uses, for example, signals (Vref+, Vref−) having a constant potential difference with respect to a voltage Vcm as reference voltages. The digital assist circuit 12 calculates the weight coefficient (correction amount Eo) using the LMS algorithm and performs the correction.

When, for example, a capacitance value of a capacitor having a value of 4 C in an ideal state has been changed to 3.8 C due to deterioration over time, this change directly causes degradation in the linearity of the DA converter 113, as a matter of course. Further, when an off-leak of a transistor that constitutes a switch has increased due to deterioration over time, this increase also cases degradation in the linearity of the DA converter 113.

Figure 6:
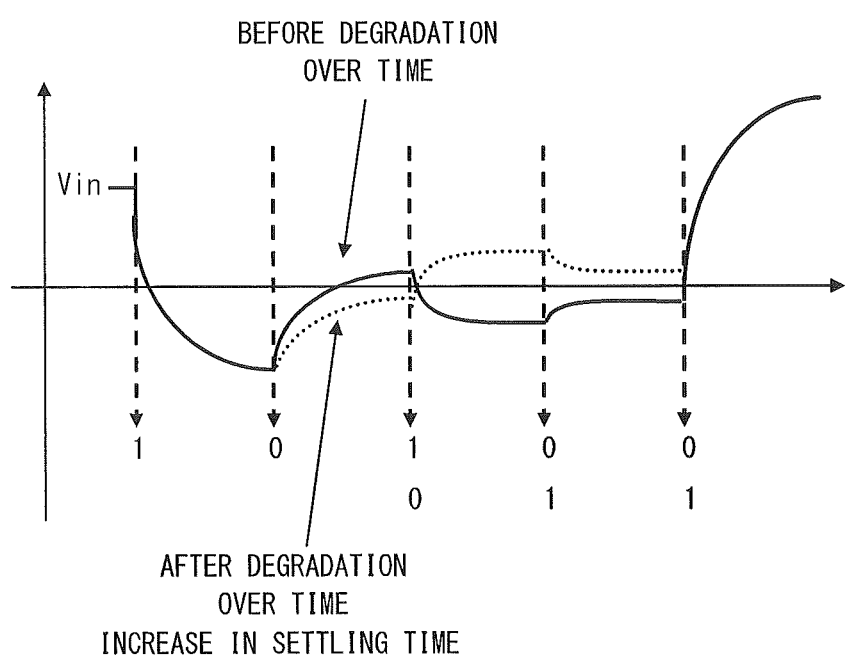
FIG. 6 is a timing chart showing an operation of the DA converter provided in the AD converter shown in FIG. 2.

Further, when an ON resistance of the transistor that constitutes the switch has increased due to deterioration over time, the settling time of the DA converter 113 increases. In this case, as shown in the dashed line of FIG. 6, the output digital code may be changed, which causes degradation in the linearity of the DA converter 113.

No matter which one of the change in the capacitance values of the capacitor, the increase in the off-leak of the transistor, and the increase in the ON resistance of the transistor occurs, since any digital code is output from the AD converter 11 and the accuracy required for the AD converter 11 is high (e.g., about 0.1 with 10-bit precision), it is quite difficult to detect that the required accuracy cannot be satisfied any more due to deterioration over time.

(Description Regarding Correction of Non-Linear Error Caused by Deterioration Over Time)

Figure 7:
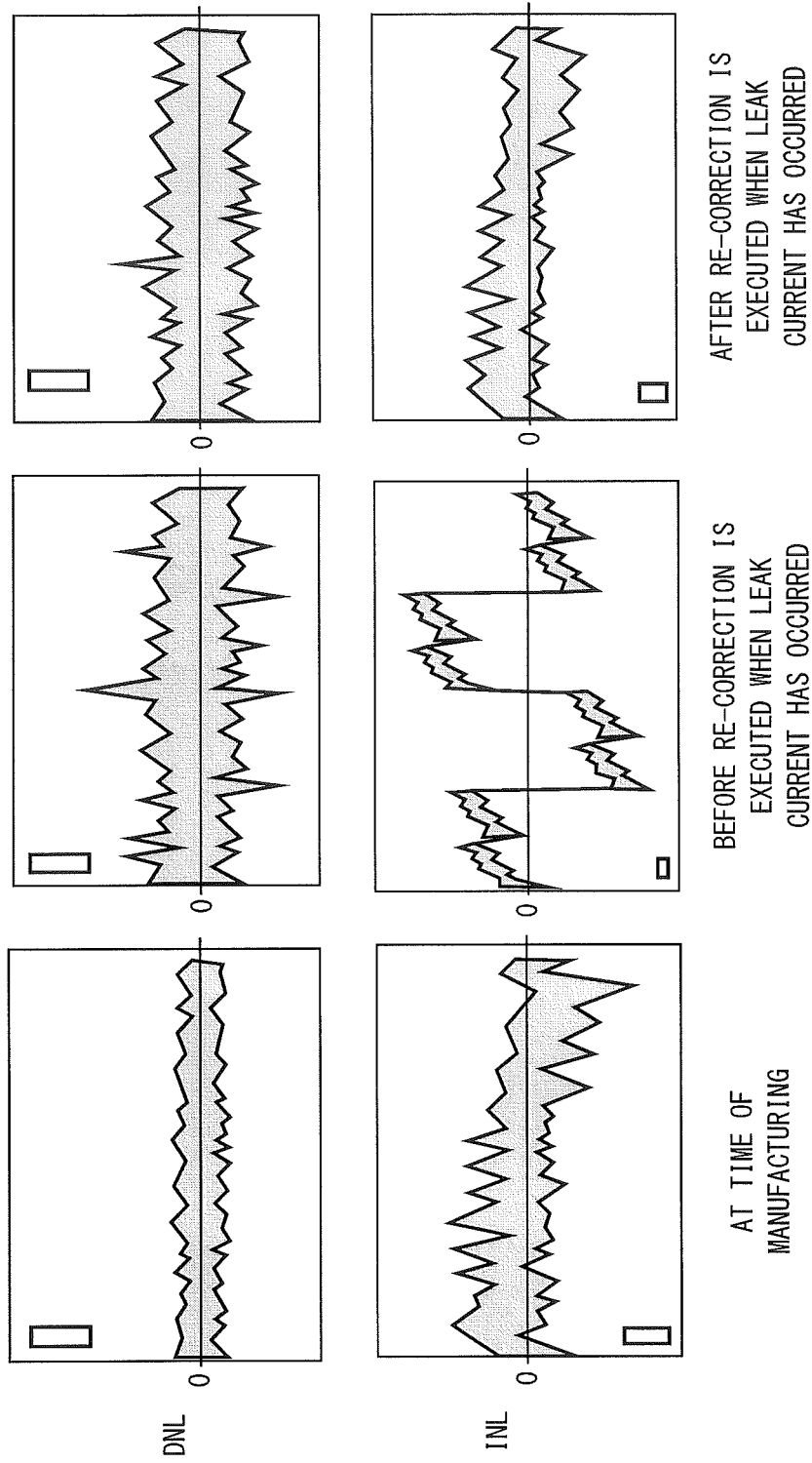
FIG. 7 shows diagrams showing non-linear errors before and after the correction of the DA converter provided in the AD converter shown in FIG. 2.

FIG. 7 shows diagrams showing non-linear errors before and after the correction of the DA converter 113 provided in the AD converter 11. The two diagrams on the left end of FIG. 7 show the non-linear errors of the DA converter 113 after the correction at the time of manufacturing the DA converter 113. The two diagrams in the middle part of FIG. 7 show the non-linear errors of the DA converter 113 before a re-correction is executed when the leak current has occurred in the DA converter 113 due to deterioration over time. The two diagrams on the right end of FIG. 7 show the non-linear errors of the DA converter 113 after the re-correction is executed when the leak current has occurred in the DA converter 113 due to deterioration over time.

First, as shown in the two diagrams on the right end of FIG. 7, the non-linear errors of the DA converter 113 after the correction at the time of manufacturing the DA converter 113 are suppressed.

However, as shown in the two diagrams in the middle part of FIG. 7, before the re-correction is executed when the leak current has occurred in the DA converter 113 due to deterioration over time, the non-linear errors of the DA converter 113 are large.

Then, as shown in the two diagrams on the right end of FIG. 7, after the re-correction is executed when the leak current has occurred in the DA converter 113 due to deterioration over time, the non-linear errors of the DA converter 113 are suppressed again. That is, the non-linear errors that have been increased due to deterioration over time are suppressed again by the digital assist circuit 12.

The size of the non-linear error varies between the time of manufacturing the DA converter 113 and the time of occurrence of the leak current in the DA converter 113 due to deterioration over time. Therefore, the correction amount Eo (weight coefficient) by the digital assist circuit 12 also varies. It is therefore possible to detect degradation in the accuracy of the AD converter 11 due to deterioration over time (in other words, excessive variation among elements due to deterioration over time) based on the difference in the correction amount Eo.

In recent years, a digital control is used in many situations and deterioration over time of the analog circuit such as the AD converter may cause degradation in the accuracy of the digital control. It is therefore important to detect degradation in the accuracy of the analog circuit due to deterioration over time (excessive variation among elements) as a failure.

In order to solve the above problem, the semiconductor device 1 according to this embodiment includes the failure detection circuit 13 and detects whether the AD converter 11 has a failure due to deterioration over time or the like based on the correction amount Eo (weight coefficient) by the digital assist circuit 12.

The failure detection circuit 13 determines, for example, that the AD converter 11 has a failure when the correction amount Eo by the digital assist circuit 12 is larger than a predetermined threshold and determines that the AD converter 11 does not have a failure when the correction amount Eo by the digital assist circuit 12 is smaller than the predetermined threshold.

FIG. 8 is a diagram showing a weight coefficient for each bit of the DA converter 113 provided in the AD converter 11 when the DA converter 113 is manufactured and it is deteriorated over time. In the example shown in FIG. 8, the bit width of the DA converter 113 is 14 bits: w13 indicates the most significant bit and w0 indicates the least significant bit. The value of the weight coefficient shown in FIG. 8 is normalized by 1 LSB.

As shown in FIG. 8, in the most significant bit (w13), for example, the weight coefficient when the DA converter 113 is manufactured (weight coefficient before deterioration over time) is 2048.00, whereas the weight coefficient when the leak current occurs and the re-correction is executed (weight coefficient after deterioration over time) is 2051.50. This leads to the non-linear error (element variation) of about 3.5 LSB occurring due to deterioration over time. The failure detection circuit 13 detects the failure based on, for example, this non-linear error (element variation).

It is possible to calculate further parameters from the weight coefficients shown in FIG. 8. The parameters include, for example, radix, which is the ratio of the adjacent weight coefficients (e.g., W13/W12, W12/W11, . . . , W1/W0) and p-radix obtained by adding or subtracting the adjacent weight coefficients (e.g., Wn−W(n−1)−W(n−1), where n is an integer equal to 0 or larger: specifically, W13−W12−W12).

For example, the failure detection circuit 13 directly detects the failure from the weight coefficient (correction amount Eo). Alternatively, the failure detection circuit 13 may detect the failure using radix expressed by the ratio of the weight coefficients of the adjacent bits. In one more alternative, the failure detection circuit 13 may detect the failure using p-radix expressed by subtracting and multiplying the weight coefficients of the adjacent bits. When p-radix is used, there is no need to provide a divider. It is therefore possible to form the failure detection circuit 13 by a simple circuit or software.

Further, the failure detection circuit 13 detects the failure when, for example, the weight coefficient is deviated from an average value by an amount larger than a threshold (e.g., an amount of deviation corresponding to 16 LSB). Alternatively, the failure detection circuit 13 detects the failure when the weight coefficient is deviated by, for example, an amount larger than 10 σ. Needless to say, the same is applied also to a case in which radix or p-radix is used.

As described above, the semiconductor device 1 according to this embodiment includes the digital assist circuit 12 that corrects the non-linear error of the digital signal output from the AD converter 11 and is able to detect the excessive variation among the elements that constitute the AD converter 11 due to deterioration over time as a failure based on the correction amount Eo by the digital assist circuit 12.

While the case in which the AD converter 11 is the successive approximation AD converter has been described in this embodiment, the present invention is not limited to this example. The AD converter 11 may be, for example, a pipeline type converter or a flash type converter. Further, the AD converter is not limited to be the AD converter 11 and it may be a desired analog circuit in which a correction can be performed by the digital assist circuit 12.

<Second Embodiment>

In this embodiment, some specific examples of the semiconductor device 1 will be described.

(First Specific Configuration Example of Semiconductor Device 1)

Figure 9:
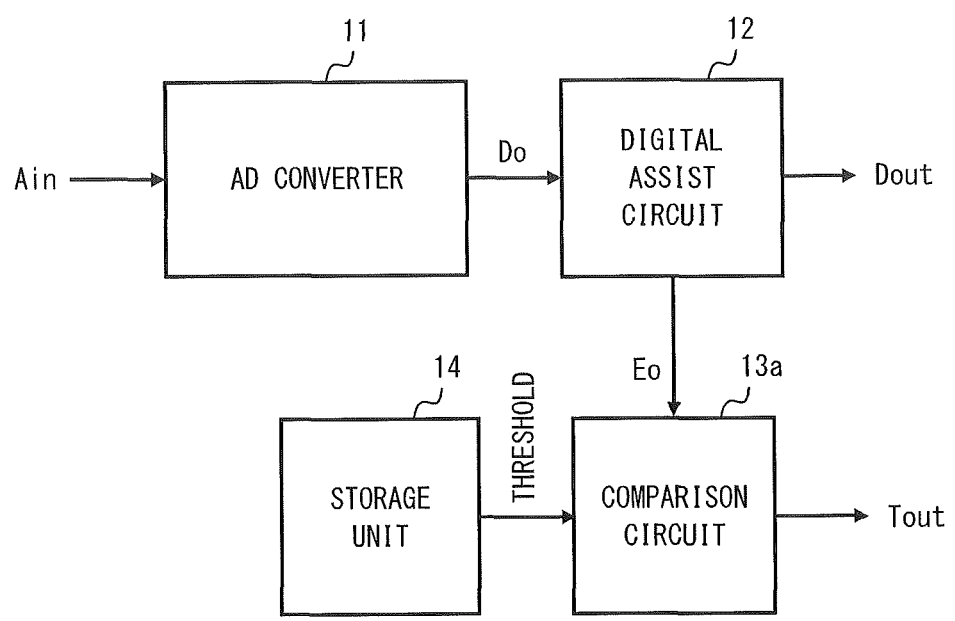
FIG. 9 is a block diagram showing a first specific configuration example of the semiconductor device shown in FIG. 1.

FIG. 9 is a block diagram showing a first specific configuration example of the semiconductor device 1 as a semiconductor device 1a.

As shown in FIG. 9, the semiconductor device 1a include a comparison circuit 13a as the failure detection circuit 13 and further includes a storage unit 14. Since the other configurations of the semiconductor device 1a are similar to those described in the semiconductor device 1, descriptions thereof will be omitted.

The storage unit 14 is, for example, a nonvolatile memory such as a read only memory (ROM) and is mounted on the semiconductor device 1a. While the case in which the semiconductor device 1a is formed on one semiconductor chip will be described as an example, the present invention is not limited to this example and the semiconductor device 1a may be formed on a plurality of semiconductor chips that are combined with each other.

The storage unit 14 stores a predetermined threshold, which serves as a reference for determining whether the AD converter 11 has a failure at the time of designing the storage unit 14. The comparison circuit 13a compares a weight coefficient (correction amount Eo) calculated by the digital assist circuit 12 with the predetermined threshold stored in the storage unit 14 to determine whether the AD converter 11 has a failure. The predetermined threshold may be a desired value.

Figure 10:
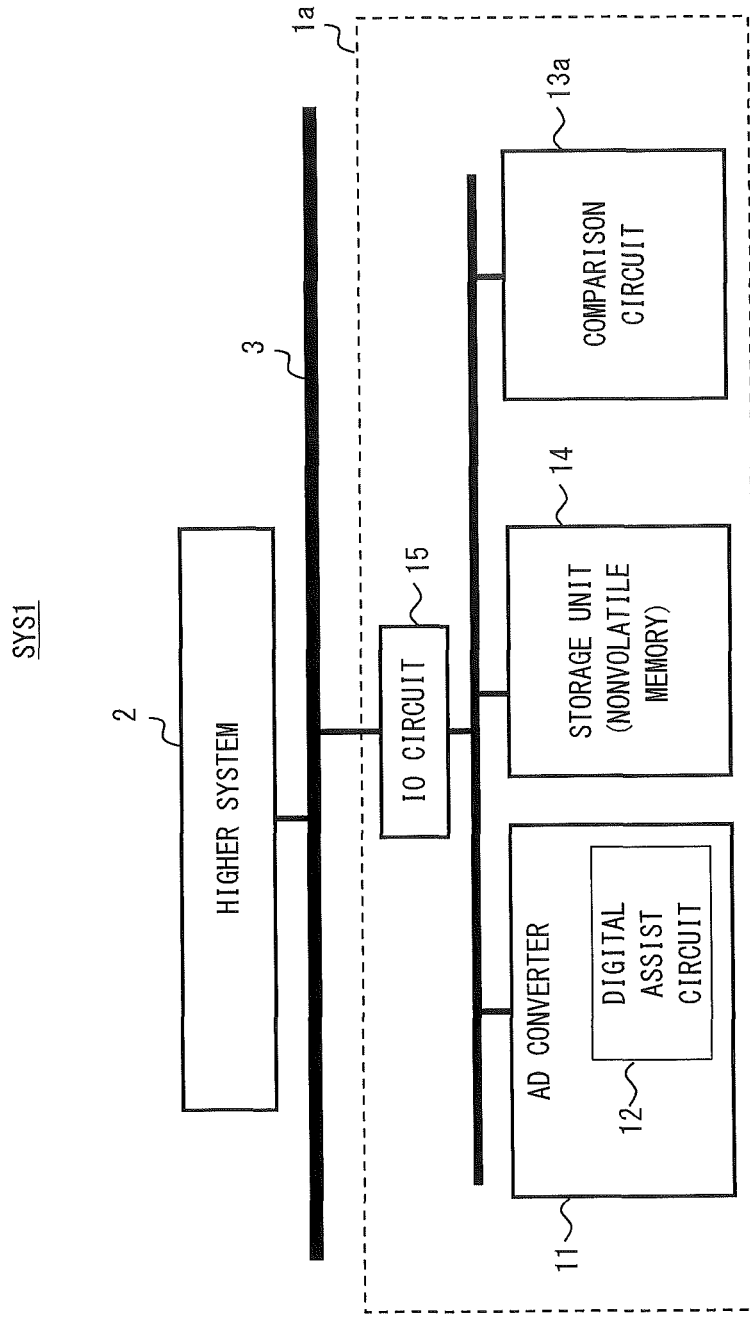
FIG. 10 is a block diagram showing a configuration example of a semiconductor system on which the semiconductor device shown in FIG. 9 is mounted.

FIG. 10 is a block diagram showing a configuration example of a semiconductor system SYS1 on which the semiconductor device 1a is mounted. As shown in FIG. 10, the semiconductor system SYS1 includes the semiconductor device 1a, a higher system 2 that executes predetermined processing using the semiconductor device 1a, and a bus 3 that connects the semiconductor device 1a and the higher system 2. In the example shown in FIG. 10, an IO circuit 15 is provided between the semiconductor device 1a and the bus 3.

Figure 11:
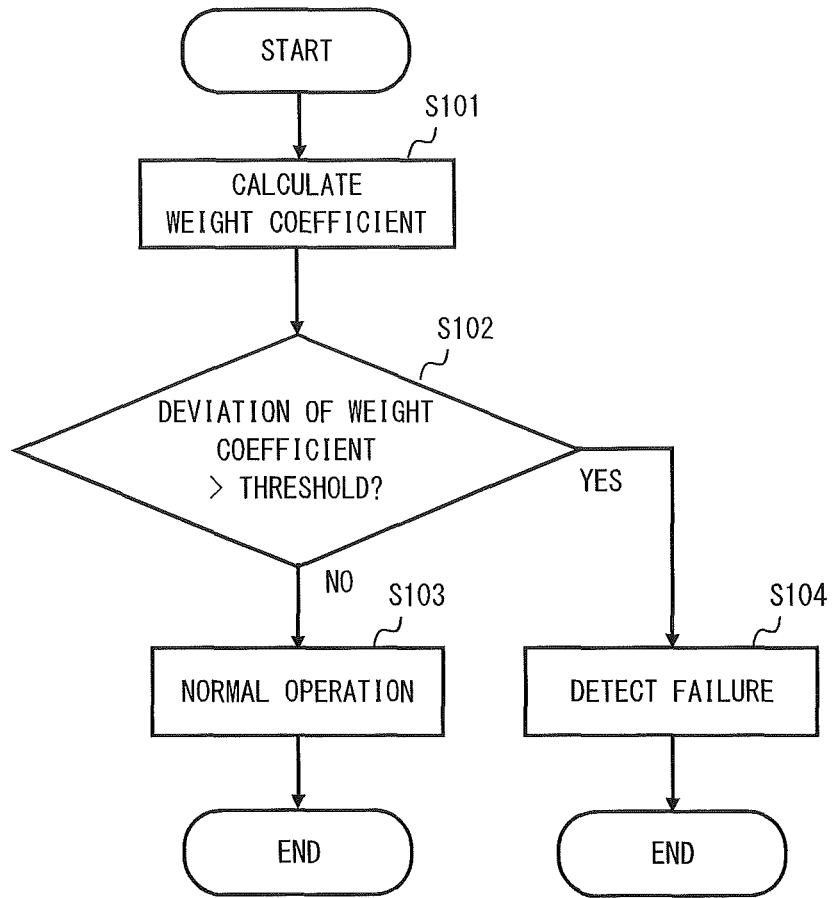
FIG. 11 is a flowchart showing an operation of the semiconductor system shown in FIG. 10.

FIG. 11 is a flowchart showing an operation of the semiconductor system SYS1.

As shown in FIG. 11, first, the semiconductor device 1a calculates the weight coefficient (correction amount Eo) using the digital assist circuit 12 when, for example, a power supply is turned on or when a sleep mode of the AD converter 11 is cancelled (Step S101).

When the deviation of the weight coefficient (correction amount Eo) is equal to or smaller than the predetermined threshold (NO in Step S102), the comparison circuit 13a provided in the semiconductor device 1a outputs a result of the comparison (result of the detection) indicating that the AD converter 11 does not have a failure. The higher system 2 then causes the semiconductor device 1a to continue executing a normal operation based on the result of the comparison (Step S103). On the other hand, when the deviation of the weight coefficient is larger than the predetermined threshold (YES in Step S102), the comparison circuit 13a provided in the semiconductor device 1a outputs a result of the comparison (result of the detection) indicating that the AD converter 11 has a failure (Step S104). The higher system 2 therefore stops, for example, the use of the semiconductor device 1a.

Figure 12:
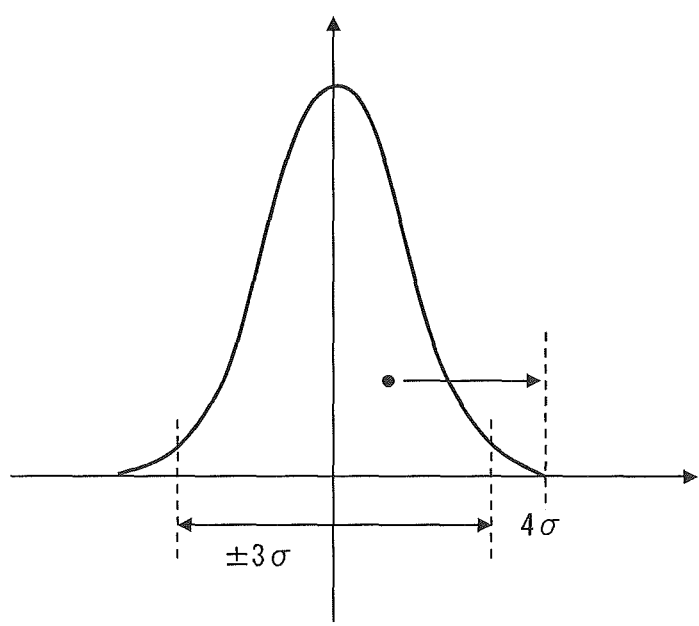
FIG. 12 is a diagram showing a normal distribution of element variations.

FIG. 12 is a diagram showing a normal distribution of element variations. As can be seen from FIG. 12, when the elements are varied with the deviation of ±3 σ or larger at the time of manufacturing the AD converter 11, this product is treated as a defective product. Even for the products that have been determined to be non-defective products, when the elements are varied with a deviation larger than the threshold (in this example, ±4σ) in the normal operation, the failure detection circuit 13 outputs the result of the detection indicating that the AD converter 11 has a failure.

Since the semiconductor system SYS1 always uses the constant threshold, the threshold may not be stored in a programmable nonvolatile memory and it may be stored in a normal nonvolatile memory. Therefore, the semiconductor system SYS1 can be implemented by a simple circuit configuration.

(Second Specific Configuration Example of Semiconductor Device 1)

Figure 13:
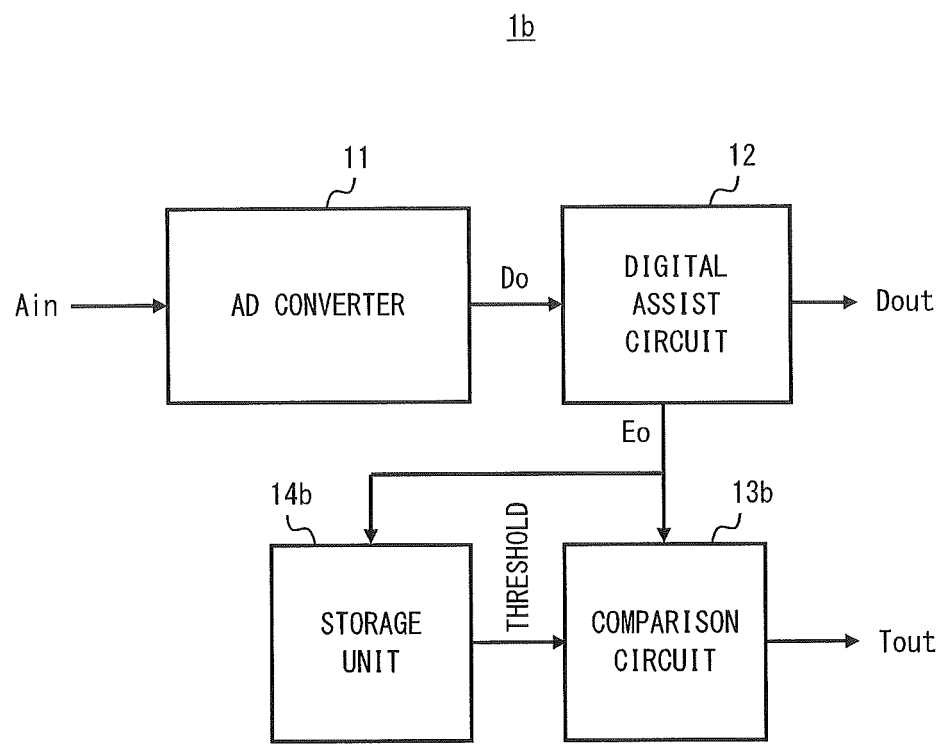
FIG. 13 is a block diagram showing a second specific configuration example of the semiconductor device shown in FIG. 1.

FIG. 13 is a block diagram showing a second specific configuration example of the semiconductor device 1 as a semiconductor device 1b.

As shown in FIG. 13, the semiconductor device 1b includes a comparison circuit 13b as the failure detection circuit 13 and further includes a storage unit 14b. Since the other configurations of the semiconductor device 1b are similar to those described in the semiconductor device 1, descriptions thereof will be omitted.

The storage unit 14b is, for example, a programmable nonvolatile memory such as an EEPROM, a flash, or an eFuse, and is mounted on the semiconductor device 1b. While the example in which the semiconductor device 1b is formed on one semiconductor chip will be described, similar to the above description, the present invention is not limited to this example and it may be formed on a plurality of semiconductor chips that are combined with each other.

The storage unit 14b stores a weight coefficient (initial correction amount Eo) before the AD converter 11 is used in the normal operation. The comparison circuit 13b compares the amount of the variation of the weight coefficient with a predetermined threshold to determine whether the AD converter 11 has a failure. The predetermined threshold may be a desired value.

Figure 14:
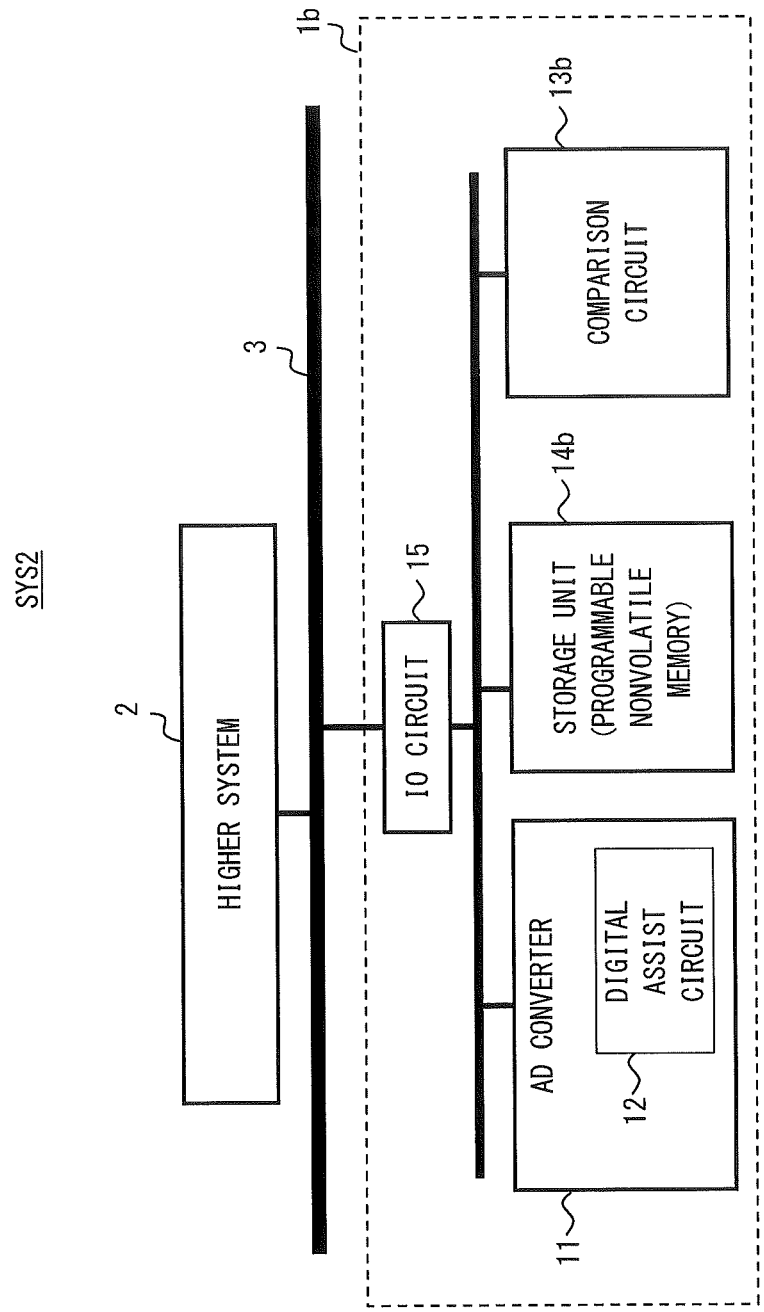
FIG. 14 is a block diagram showing a configuration example of a semiconductor system on which the semiconductor device shown in FIG. 13 is mounted.

FIG. 14 is a block diagram showing a configuration example of a semiconductor system SYS2 on which the semiconductor device 1b is mounted. As shown in FIG. 14, the semiconductor system SYS2 includes the semiconductor device 1b, a higher system 2 that performs predetermined processing using the semiconductor device 1b, and a bus 3 that connects the semiconductor device 1b and the higher system 2. In the example shown in FIG. 14, an IO circuit 15 is provided between the semiconductor device 1b and the bus 3.

Figure 15:
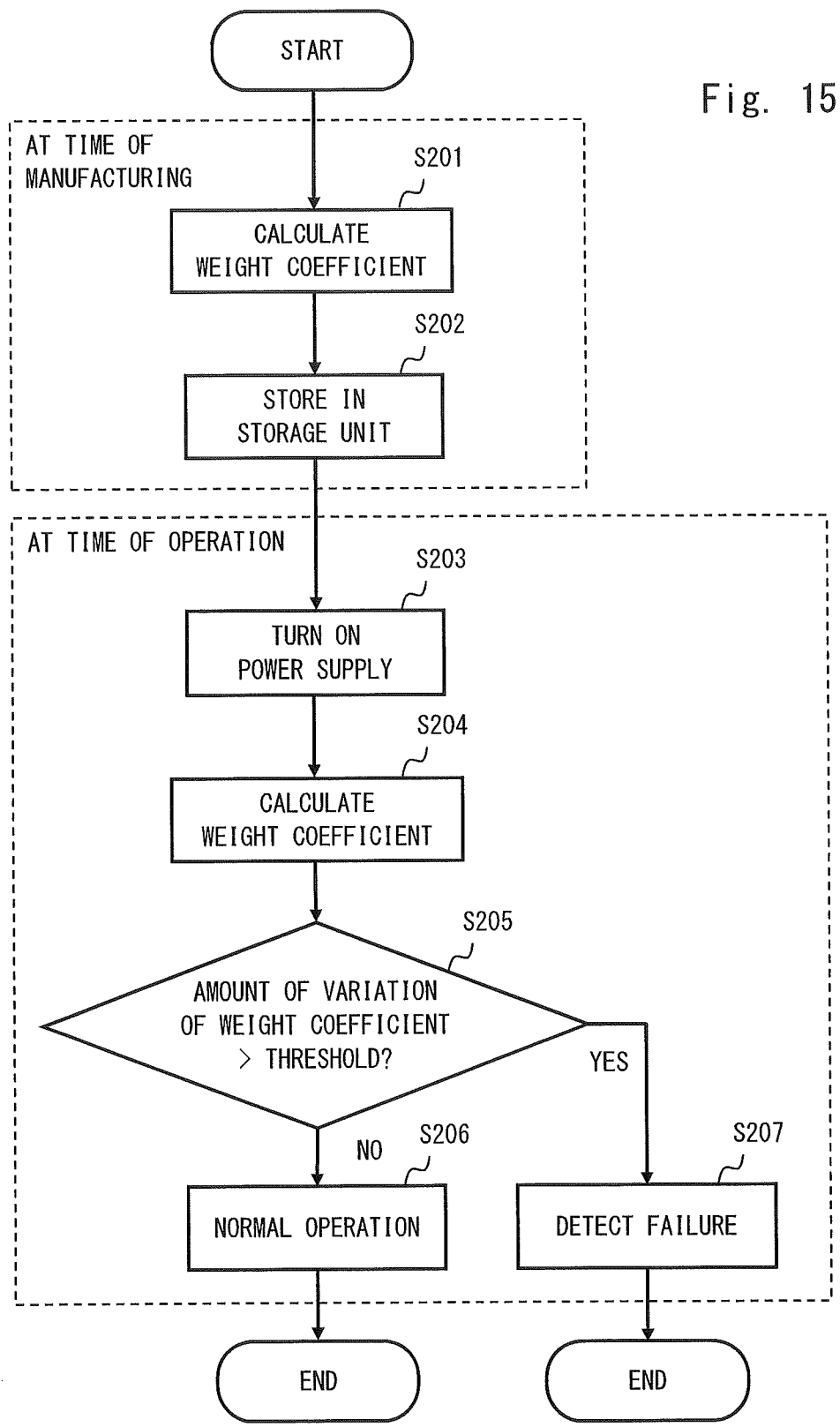
FIG. 15 is a flowchart showing an operation of the semiconductor system shown in FIG. 14.

FIG. 15 is a flowchart showing an operation of the semiconductor system SYS2.

As shown in FIG. 15, first, the higher system 2 calculates the weight coefficient (initial correction amount Eo) using the digital assist circuit 12 in the semiconductor device 1b at the time of manufacturing the semiconductor device 1b (Step S201). This initial weight coefficient is stored in the storage unit 14b in the semiconductor device 1b (Step S202).

After that, the semiconductor device 1b calculates, when a power supply is turned on in the normal operation (Step S203), a weight coefficient (correction amount EO) using the digital assist circuit 12 (Step S204). The timing when the weight coefficient is calculated is not limited to the timing when the power supply is turned on and the weight coefficient may be calculated when, for example, the sleep mode of the AD converter 11 is cancelled.

When the amount of the variation of the weight coefficient is equal to or smaller than a predetermined threshold (e.g., 1 LSB) (NO in Step S205), the comparison circuit 13b provided in the semiconductor device 1b outputs the result of the comparison (result of the detection) indicating that the AD converter 11 does not have a failure. The higher system 2 then causes the semiconductor device 1b to continue executing the normal operation based on the result of the comparison (Step S206). On the other hand, when the amount of the variation of the weight coefficient is larger than the predetermined threshold (YES in Step S205), the comparison circuit 13b provided in the semiconductor device 1b outputs the result of the comparison (result of the detection) indicating that the AD converter 11 has a failure (Step S207). The higher system 2 therefore stops, for example, the use of the semiconductor device 1b.

According to the above configuration, the semiconductor system SYS2 is able to detect the excessive variation among the elements that constitute the AD converter 11 due to deterioration over time or the like as a failure more accurately.

(Modified Example of Semiconductor System SYS2)

Figure 16:
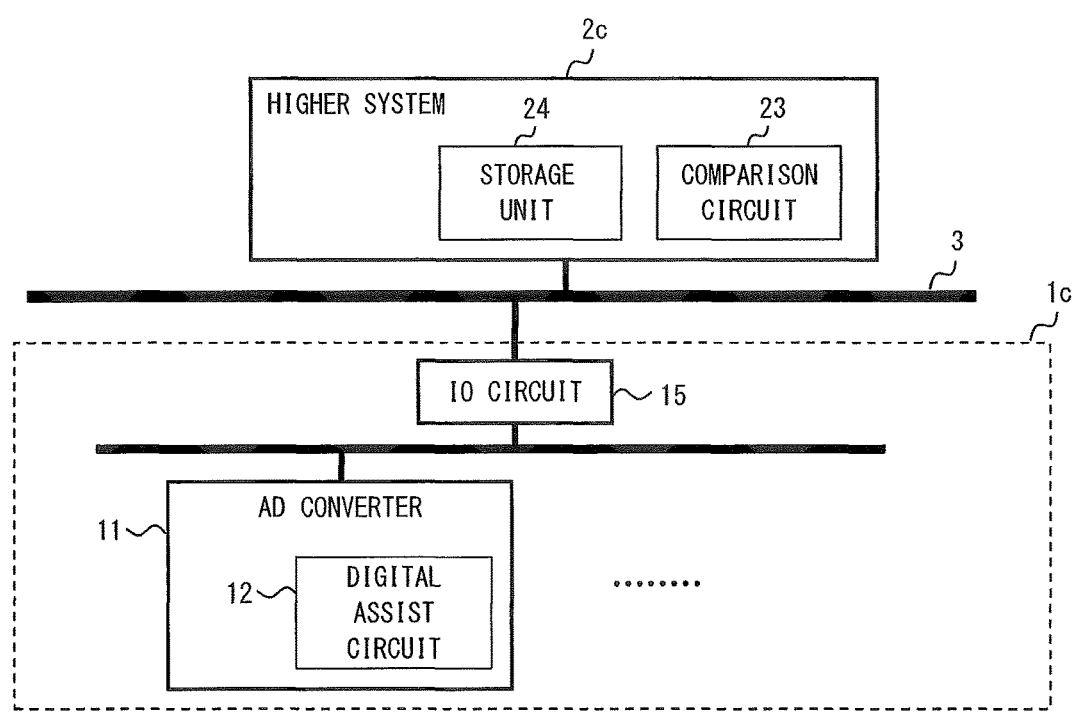
FIG. 16 is a block diagram showing a modified example of the semiconductor system shown in FIG. 14.

FIG. 16 is a block diagram showing a modified example of the semiconductor system SYS2 as a semiconductor system SYS3. As shown in FIG. 16, the semiconductor system SYS3 includes a semiconductor device 1c, a higher system 2c that executes predetermined processing using the semiconductor device 1c, and a bus 3 that connects the semiconductor device 1c and the higher system 2c.

In the semiconductor system SYS3, a comparison circuit 23 is provided in the higher system 2c in place of the comparison circuit 13b being provided in the semiconductor device 1c. Further, the initial weight coefficient calculated by the digital assist circuit 12 is stored in a storage unit 24 in the higher system 2c, not in the storage unit in the semiconductor device 1c. Since the configurations of the semiconductor system SYS3 are similar to the configurations of the semiconductor system SYS2, descriptions thereof will be omitted.

FIG. 17 is a flowchart showing an operation of the semiconductor system SYS3.

As shown in FIG. 17, first, the higher system 2c calculates, when the power supply is turned on for the first time, for example, the weight coefficient (initial correction amount Eo) using the digital assist circuit 12 in the semiconductor device 1c (Step S301). This initial weight coefficient is stored in the storage unit 24 of the higher system 2c (Step S302).

After that, the semiconductor device 1c calculates, when the power supply is turned on in the normal operation (Step S303), the weight coefficient (correction amount Eo) using the digital assist circuit 12 (Step S304). The timing when the weight coefficient is calculated is not limited to the timing when the power supply is turned on and it may be calculated when, for example, the sleep mode of the AD converter 11 is cancelled.

When the amount of the variation of the weight coefficient is equal to or smaller than a predetermined threshold (e.g., 1 LSB) (NO in Step S305), the comparison circuit 23 provided in the higher system 2c outputs the result of the comparison (result of the detection) indicating that the AD converter 11 does not have a failure. The higher system 2c causes the semiconductor device 1c to continue executing the normal operation based on the result of the comparison (Step S306). On the other hand, when the amount of the variation of the weight coefficient is larger than the predetermined threshold (YES in Step S305), the comparison circuit 23 provided in the higher system 2c outputs the result of the comparison (result of the detection) indicating that the AD converter has a failure (Step S307). The higher system 2c therefore stops the use of the semiconductor device 1c.

According to the above configuration, the semiconductor system SYS3 is able to detect, similar to the semiconductor system SYS2, the excessive variation due to deterioration over time of the elements that constitute the AD converter 11 as a failure more accurately. Further, since the semiconductor device 1c does not need to store the correction amount Eo or to detect the failure, no additional circuit is required. The semiconductor system SYS3 is therefore able to detect the failure of the analog circuit such as the AD converter having the digital assist function that is generally used and not including the failure detection circuit.

As described above, the semiconductor device according to the first and second embodiments includes the digital assist circuit that corrects the non-linear error of the digital signal output from the AD converter and is able to detect the excessive variation among the elements that constitute the AD converter due to deterioration over time as a failure based on the correction amount by the digital assist circuit.

While the example in which the foreground calibration method is used has been described above in the first and second embodiments stated above, the present invention is not limited to the example state above and a background calibration method may be used. While the AD conversion by the AD converter 11 and the correction operation (calibration operation) by the digital assist circuit 12 are separately performed in the foreground calibration method, the AD conversion by the AD converter 11 and the correction operation by the digital assist circuit 12 are performed in parallel in the background calibration method. By using the background calibration method, it is possible to correct the non-linear error due to a temperature, a power supply voltage, and deterioration over time without stopping the operation of the AD converter 11 and to detect the failure based on the correction amount Eo.

While the invention made by the present inventors has been specifically described based on the embodiments, it is needless to say that the present invention is not limited to the embodiments stated above and may be changed in various ways without departing from the spirit of the present invention.

For example, in the semiconductor device according to the above embodiments, the conductive type (p-type or n-type) of each of a semiconductor substrate, a semiconductor layer, a diffusion layer (diffusion region) may be inverted. Therefore, when one conductive type of the n type and the p type is a first conductive type and the other one of the n type and the p type is a second conductive type, the first conductive type may be the p type and the second conductive type may be the n type and vice versa.

The first and second embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device, comprising:
   an analog circuit;
   a digital assist circuit that corrects an error of a digital signal corresponding to an analog signal processed by the analog circuit; and
   a failure detection circuit that detects whether the analog circuit has a failure based on a correction amount by the digital assist circuit, wherein the failure detection circuit detects a failure by evaluating one of:
     whether a weight coefficient Eo exceeds a predesignated threshold;
     whether a deviation from an average amount of the weight coefficient Eo exceeds a predesignated threshold;
     whether a radix (a ratio of weight coefficients of adjacent bits) of an AD converter exceeds a predesignated threshold; and
     whether a p-radix (an addition or subtraction of weight coefficients of adjacent bits) of the AD converter exceeds a predesignated threshold.

2. The semiconductor device according to claim 1, wherein the failure detection circuit determines that the analog circuit has a failure when the correction amount is larger than a predetermined threshold.

3. The semiconductor device according to claim 1, wherein the failure detection circuit determines that the analog circuit has a failure when a difference between the correction amount and an initial correction amount, which is the correction amount before the analog circuit is used in a normal operation, is larger than a predetermined threshold.

4. The semiconductor device according to claim 3, further comprising a storage unit that stores the initial correction amount.

5. The semiconductor device according to claim 4, wherein the storage unit is a programmable nonvolatile memory.

6. The semiconductor device according to claim 3, wherein the initial correction amount is stored in a storage unit outside of the semiconductor device.

7. The semiconductor device according to claim 1, wherein:
the analog circuit is an analog-to-digital (AD) converter; and
the digital assist circuit corrects a non-linear error of the digital signal output from the AD converter corresponding to the analog signal input to the AD converter.

8. A semiconductor system comprising:
The semiconductor device according to claim 1; and
a higher system that performs predetermined processing for the semiconductor device based on the result of the detection of the failure output from the semiconductor device.

9. A failure detection method, comprising:
correcting an error of a digital signal corresponding to an analog signal processed by an analog circuit using a digital assist circuit; and
detecting whether the analog circuit has a failure based on a correction amount by the digital assist circuit,
wherein the digital assist circuit comprises:
a weight coefficient calculation unit; and
a correction unit.

10. The failure detection method according to claim 9, wherein it is determined that the analog circuit has a failure when the correction amount is larger than a predetermined threshold.

11. The failure detection method according to claim 9, wherein it is determined that the analog circuit has a failure when a difference between the correction amount and an initial correction amount, which is the correction amount before the analog circuit is used in a normal operation, is larger than a predetermined threshold.

12. The failure detection method according to claim 11, further comprising storing the initial correction amount in a storage unit provided on a same semiconductor chip on which the analog circuit is mounted.

13. The failure detection method according to claim 12, wherein the storage unit is a programmable nonvolatile memory.

14. The failure detection method according to claim 11, further comprising storing the initial correction amount in a storage unit provided on a semiconductor chip different from a semiconductor chip on which the analog circuit is mounted.

15. The semiconductor device according to claim 7, wherein the digital assist circuit corrects a non-linear error of the digital signal output by determining and providing a correction amount Eo of a weight coefficient of the AD converter, and
wherein the failure detection circuit detects whether the analog circuit has a failure based on whether the correction amount Eo is larger than a predetermined threshold.

16. The semiconductor device according to claim 7, wherein a variation of elements constituting the AD converter provides a radix<2.

17. A semiconductor device, comprising:
an analog circuit
a digital assist circuit that corrects an error of a digital signal corresponding to an analog signal processed by the analog circuit; and
a failure detection circuit that detects whether the analog circuit has a failure based on a correction amount by the digital assist circuit,
wherein the analog circuit comprises an analog-to-digital (AD) converter and wherein a variation of elements constituting the AD converter is smaller than 0.5 of a least significant bit (LSB) of the AD converter.

18. The semiconductor device according to claim 1, wherein the analog circuit comprises one of:
a successive approximation analog-to-digital (AD) converter;
a pipeline type AD converter;
a flash type AD converter; and
an analog circuit in which a correction can be performed by the digital assist circuit.

* * * * *